(12) United States Patent
Dhaoui et al.

(10) Patent No.: US 7,768,317 B1
(45) Date of Patent: Aug. 3, 2010

(54) RADIATION-TOLERANT FLASH-BASED FPGA MEMORY CELLS

(75) Inventors: Fethi Dhaoui, Patterson, CA (US);
Zhigang Wang, Sunnyvale, CA (US);
John McCollum, Saratoga, CA (US);
Richard Chan, Los Altos, CA (US);
Vidyadhara Bellippady, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 43 days.

(21) Appl. No.: 12/124,661

(22) Filed: May 21, 2008

(51) Int. Cl.
*H03K 19/094* (2006.01)
(52) U.S. Cl. .................. 326/113; 326/86; 326/93
(58) Field of Classification Search ............... 326/113, 326/38, 30, 49; 365/185.1, 185.28, 185.29
See application file for complete search history.

(56) References Cited

U.S. PATENT DOCUMENTS

| | | | | |
|---|---|---|---|---|
| 4,713,557 A | * | 12/1987 | Carter | 326/86 |
| 5,515,320 A | * | 5/1996 | Miwa | 365/185.1 |
| 5,517,135 A | * | 5/1996 | Young | 326/86 |
| 5,583,452 A | * | 12/1996 | Duong et al. | 326/49 |
| 5,801,551 A | * | 9/1998 | Lin | 326/113 |
| 5,844,424 A | * | 12/1998 | Krishnamurthy et al. | 326/49 |
| 6,125,059 A | * | 9/2000 | Hecht | 365/185.29 |
| 6,324,102 B1 | | 11/2001 | McCollum | |
| 6,366,498 B1 | * | 4/2002 | Madurawe et al. | 365/185.28 |
| 6,552,576 B1 | * | 4/2003 | Bobba et al. | 326/113 |
| 6,711,093 B1 | * | 3/2004 | Shore et al. | 365/236 |
| 6,777,742 B2 | | 8/2004 | Jong et al. | |
| 6,812,734 B1 | * | 11/2004 | Shumarayev et al. | 326/30 |
| 7,365,563 B1 | * | 4/2008 | Rahman | 326/26 |
| 2004/0004499 A1 | * | 1/2004 | Yonemaru | 326/113 |

* cited by examiner

*Primary Examiner*—Vibol Tan
*Assistant Examiner*—Crystal L Hammond
(74) *Attorney, Agent, or Firm*—Lewis and Roca LLP

(57) ABSTRACT

A radiation-tolerant flash-based FPGA switching element includes a plurality of memory cells each having a memory transistor and a switch transistor sharing a floating gate. Four such memory cells are combined such that two sets of two switch transistors are wired in series and the two sets of series-wired switch transistors are also wired in parallel. The four memory transistors associated with the series-parallel combination of switch transistors are all programmed to the same on or off state. The series combination prevents an "on" radiation-hit fault to one of the floating gates from creating a false connection and the parallel combination prevents an "off" radiation-hit fault to one of the floating gates from creating a false open circuit.

27 Claims, 7 Drawing Sheets

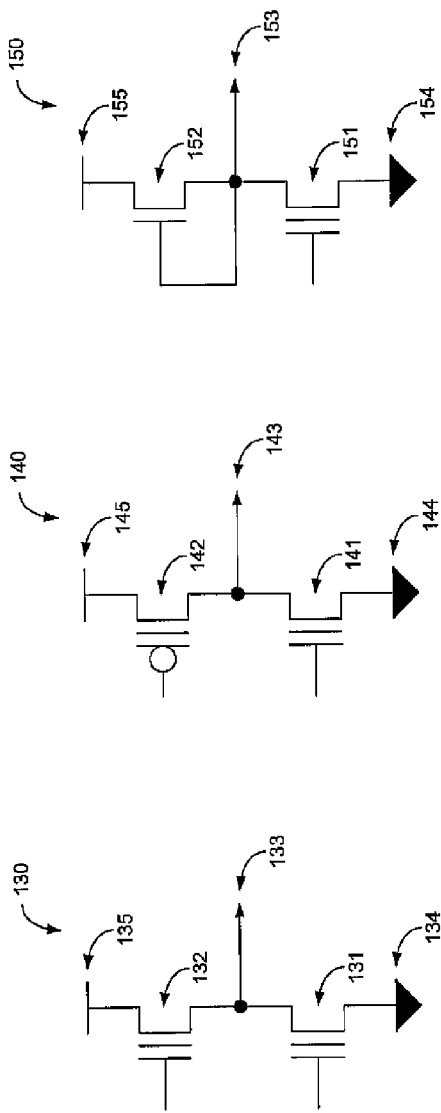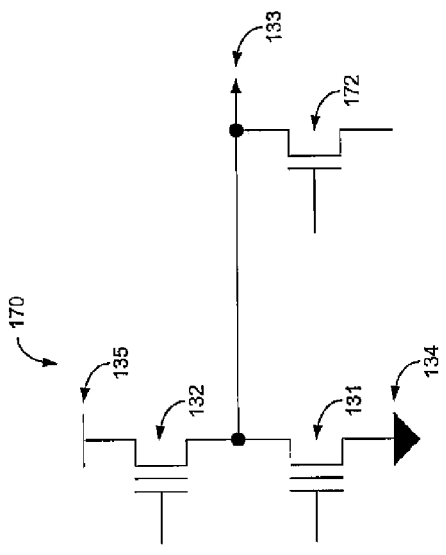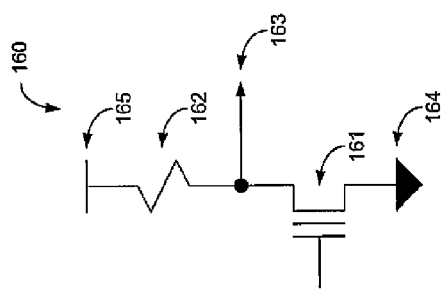

RADIATION-TOLERANT FLASH-BASED FPGA MEMORY CELLS

BACKGROUND OF THE INVENTION

1. Field of the Invention

The Present invention relates to flash-based field-programmable gate array (FPGA) integrated circuits. More particularly, the present invention relates to a radiation-tolerant flash-based field-programmable gate array.

2. The Prior Art

Flash-based field-programmable gate array integrated circuits are known in the art. Such FPGAs use a flash switch including a floating gate memory transistor that shares a floating gate with a switch transistor that is used to make programmable connections between circuit nodes in the FPGA device. Both the memory transistor and the switch transistor are typically n-channel transistors. Radiation due to heavy ions will damage the silicon dioxide either above or below the floating gate in a flash switch in a FPGA device. Over time in a radiation environment, an increasing portion of the flash switches in the FPGA will be affected.

A heavy ion passing through the silicon dioxide either above or below the floating gate can dislocate atoms from their nominal location in the lattice structure making up the oxide. These irregularities can become charge traps that would not exist in undamaged oxide. The presence of these unwanted charge traps can allow electrons to slowly migrate from the floating gate by hopping from charge trap to charge trap. This will cause the flash switch to change state, either from an on state to an off state or vice versa. This state change cannot be tolerated since it will cause unpredictable behavior in the programmed circuit that is configured in the FPGA.

Referring now to FIG. 1A, a schematic diagram shows a portion of a prior-art memory cell illustrating its use in an FPGA to allow a programmable a connection between two circuit elements and demonstrates one of the problems inherent in the prior art. Circuit 10 and circuit 12 are disposed in an FPGA integrated circuit. Switch transistor 14 is coupled between circuit 10 and circuit 12 by means of interconnects 11 and 13 respectively. If the memory transistor (not shown) with which it shares a floating gate is erased, switch transistor 14 will be turned on and a connection will be made between circuit 10 and circuit 12. If, however, the memory transistor with which it shares a floating gate is programmed, switch transistor 14 will not be turned on and a connection will not be made between circuit 10 and circuit 12.

This circuit arrangement is satisfactory unless a radiation event occurs with respect to the floating gate shared by switch transistor 14 and the memory transistor with which it is associated. In such a case, the radiation can act to program the floating gate that was intended to remain erased, or erase the floating gate that was intended to remain programmed. The result is either that an unintended connection is made between circuit 10 and circuit 12 or an intended connection between circuit 10 and 12 is severed. In either case, the operation of the circuit programmed into the FPGA is compromised and the result is unpredictable, since there is no way to know which floating gate will be hit by a radiation event and whether the event will act to program or erase the affected floating gate.

Floating gate transistors are not the only type of non-volatile flash transistor known in the art. Other flash technologies like, for example, SONOS and nano-crystal are also known. The common characteristic amongst these technologies is that each has a mechanism for deliberately storing electrical charge between the external gate node and the channel region of the transistor and for selectively adding or removing charge from that storage mechanism to control the transistor threshold voltage. The stored charges remain when the part is powered down allowing the programming information to remain, hence the non-volatile nomenclature.

In floating gate transistors, the control charges on the floating gate are mobile within the confines of the floating gate, while in SONOS or nano-crystal technologies the control charges are not mobile. In embodiments where a memory transistor and a switch transistor share a floating gate, the ability of stored charges to move freely between the memory and switch transistors is essential and the flash technologies with immobile control charges would not be suitable in such embodiments. In other embodiments, all flash technologies are suitable.

Other sorts of transistors are present on an FPGA employing any non-volatile technology. For purposes of this specification, these transistors will be called "standard transistors" meaning a normal MOSFET transistor, either n-channel or p-channel, as is well known in the art, that has no deliberately fabricated charge storage mechanism between the gate and channel. Thus standard transistors cannot have charge selectively added or removed to deliberately control the transistor threshold voltage. In any particular application or embodiment, a standard transistor may be, for example, a low-voltage thin-gate-oxide logic transistor, a middle-voltage medium-gate-oxide I/O transistor, or a high-voltage thick-gate-oxide transistor, all of which are well known in the art and typically present in a flash-based FPGA, as a matter of design choice. Standard transistors may be either n-channel or p-channel and either type may be doped to have a positive or negative threshold voltage, though typically n-channel transistors have positive threshold voltages and p-channel transistors have negative threshold voltages. As is known in the art, n-channel transistors conduct current by means of negatively charged electrons when turned on by applying a higher voltage to the gate terminal than in the off state, while p-channel transistors conduct current by means of positively charged holes when turned on by applying a lower voltage to the gate terminal than in the off state. In some places in this specification a further qualified phrase like, for example, "a standard switch transistor" is used meaning a switch made from a standard transistor.

Also known in the art are FPGAs built exclusively of standard transistors. Such FPGAs necessarily use volatile memory cells like, for example, Static Random Access Memory (SRAM) cells, that must be initialized to hold their programming information. FIG. 5A illustrates an SRAM memory cell 180 of a type that is well known in the art that can be used in such an FPGA. Memory cell 180 comprises cross-coupled inverters 181 and 182, pass transistors 183 and 184, row access line 185 which is coupled to the gates of pass transistors 183 and 184, output node 186 which is coupled to the source of pass transistor 184, the input of inverter 182 and the output of inverter 181, and complimentary node 187 which is coupled to the source of pass transistor 183, the output of inverter 182 and the input of inverter 181. The drains of pass transistors 183 and 184 are coupled to a pair of complimentary column access lines not shown. Cross-coupled inverters 181 and 182 form a latch capable of storing one bit of binary data. Pass transistors 183 and 184 provide read or write access to the latch when row access line 185 is driven to logic-1. Output node 186 is coupled to a circuit or device in the FPGA that needs to be controlled like, for example, a standard switch transistor. Complimentary node 187 could also be brought out, alternatively or additionally, to be used to control FPGA circuitry or devices.

Different radiation effects resulting in different failure mechanisms come into play in an SRAM based FPGA. While heavy ions can damage the gate oxide of a standard transistor, unless the damage is extremely severe (to the point where the gate gets shorted to the silicon substrate underneath the gate) the result is an undesirable but typically tolerable amount of gate leakage. While gate leakage is catastrophic for a floating gate transistor since the floating gate is no longer isolated and charge can leak off changing the programming state, a standard transistor with a moderate amount of gate leakage will still continue to function like a standard transistor.

In SRAM based FPGAs, the major concern for the programming memory cells is Single Event Upset (SEU) which can be caused not only by heavy ions but also by much lighter charged particles like, for example, electrons, protons and helium nuclei (alpha particles). When a charged particle passes through a doped semiconductor region, it ionizes the atoms it encounters leaving a temporary surplus of unwanted hole and electron pairs in its wake. If the particle crosses a boundary between differently doped regions (a p/n junction) that are operating at different voltages, the surplus carries have the effect of creating a temporary short between the two regions that are normally isolated by the p/n junction and current can flow from one region to the other. If one of the regions is the drain node of one of the transistors in either inverter 181 or inverter 182 in memory cell 180, this temporary short can inject enough charge into node 186 or 187 that the memory cell 180 flips to the opposite logic value.

In FIG. 5B a Triple Module Redundancy (TMR) circuit known in the art that is typically used to provide radiation hardness by mitigating SEUs for latches such as memory cell 180 is shown generally by reference number 190. TMR circuit 190 comprises three memory cells 180. The outputs of memory cells 180 are coupled to the three inputs of a voting gate 191, that has an output node 192. Output node 192 is coupled to a circuit or device in the FPGA like, for example, a standard switch transistor, in order to control it. The voting gate, which is also known as a Majority-of-three gate or MAJ3, implements the Boolean function MAJ3(a, b, c)=(a AND b) OR (a AND c) OR (b AND c). When any two or all three inputs are driven to logic-1, the output of the voting gate 191 will be driven to logic-1. Similarly, when any two or all three inputs are driven to logic-0, the output of the voting gate 191 will be driven to logic-0. All three memory cells 180 are all programmed to the same logical value. If the logical value of one of the memory cells 180 is flipped due to SEU, the other two cells 180 and the voting gate 191 will ensure that the output node 192 remains at the correct logical value. Typically, scrubbing (repeatedly rewriting some or all of the programming data in the SRAM memory cells 180) is necessary for SRAM based FPGAs to operate reliably in a radiation environment—even with the use of TMR circuits since the TMR circuit 190 doesn't prevent SEUs from occurring but rather creates a delay in time between the first SEU affecting one of the SRAM bits 180 and a second SEU affecting a second one of the SRAM bits 180.

BRIEF DESCRIPTION OF THE DRAWING FIGURES

FIG. 4A is a flash based memory cell suitable for use in the array of FIG. 3.

FIG. 4B is a flash based memory cell suitable for use in the array of FIG. 3.

FIG. 4C is a flash based memory cell suitable for use in the array of FIG. 3.

FIG. 4D is a flash based memory cell suitable for use in the array of FIG. 3.

FIG. 4E is a flash based memory cell suitable for use in the array of FIG. 3.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

According to one aspect of the present invention, a radiation-tolerant flash-based FPGA switching element includes a plurality of memory cells each having a memory transistor and a switch transistor sharing a floating gate. The memory cells are combined in a series-parallel combination such that sets of switch transistors are wired in series and the sets of series-wired switch transistors are then wired in parallel. The four memory transistors associated with the series-parallel combination of switch transistors are all programmed to the same on or off state. The series combination prevents an "on" radiation-hit fault to one of the floating gates from creating a false connection and the parallel combination prevents an "off" radiation-hit fault to one of the floating gates from creating a false open circuit.

Figure 1A:
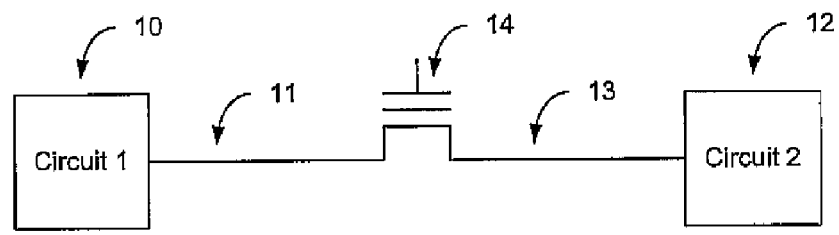
FIG. 1A is a schematic diagram showing a portion of a prior-art memory cell illustrating its use in an FPGA to allow a programmable connection between two circuit elements.
Figure 1B:
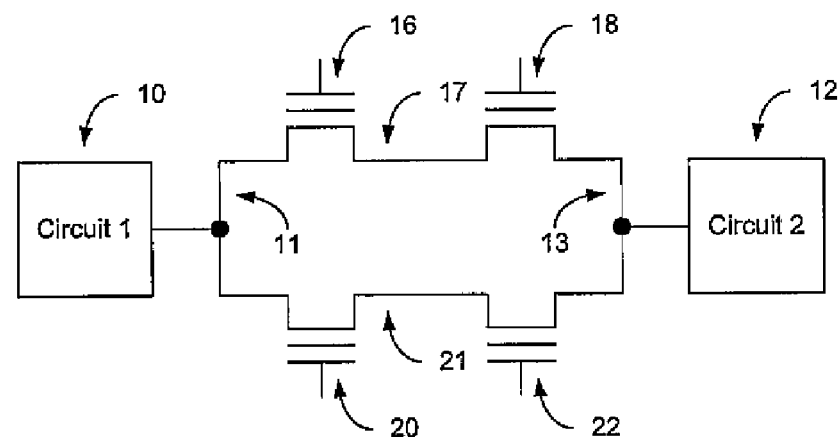
FIG. 1B is a schematic diagram showing a portion of a group of memory cells illustrating their use as a switching element in an FPGA to allow a radiation-tolerant programmable connection between two circuit elements.

Referring now to FIG. 1B, a schematic diagram shows a portion of a group of memory cells illustrating their use as a switching element in an FPGA to allow a radiation-tolerant programmable connection between two circuit elements. As in the example of FIG. 1A, a circuit net in an FPGA integrated circuit includes a switch arrangement for making a programmable connection between interconnect 11 coupled to circuit 10 and interconnect 13 coupled to circuit 12. The switch arrangement of FIG. 1B includes a first switch transistor 16, a first internal interconnect 17 and a second switch transistor 18 coupled in series between interconnect 11 and interconnect 13. The switch arrangement of FIG. 1B also includes a third switch transistor 20, a second internal interconnect 21 and a fourth switch transistor 22 coupled in series between interconnect 11 and interconnect 13. Persons of ordinary skill in the art will appreciate that switch transistors 16, 18, 20, and 22 each share a floating gate with a different memory transistor (not shown). One principle of the present invention is that the mechanism controlling each switch transistor is independent of the control mechanisms controlling all the other switch transistors. In this embodiment, that means that the floating gate of each switch transistor is independent from the floating gate of each other switch transistor.

If it is desired to make a connection between circuit 10 and circuit 12, the four memory cells associated with all four switch transistors 16, 18, 20, and 22 will be erased in order to turn on all four switch transistors 16, 18, 20, and 22. If a radiation hit strikes any one of the switch transistors 16, 18, 20, and 22 and turns it off, the connection between circuit 10 and circuit 12 remains intact. The only way that the connection would be broken would be if radiation hits struck one of switch transistors 16 and 18 and one of switch transistors 20 and 22 to place both of them in the programmed state. The probability of such a combined event is very small.

Similarly, if it is desired that a connection not be made between circuit 10 and circuit 12, the four memory cells associated with all four switch transistors 16, 18, 20, and 22 will be programmed in order to turn off all four switch transistors 16, 18, 20, and 22. If a radiation hit strikes any one of the switch transistors 16, 18, 20, and 22 and turns it on, no connection between circuit 10 and circuit 12 will be made. The only way that an undesired connection would be made would be if radiation hits struck both switch transistors 16 and 18 or radiation hits struck both switch transistors 20 and 22 to place both series transistors in one of the parallel paths in an erased state. The probability of such a combined event is very small. Persons skilled in the art will realize that, while the floating gate process described in this embodiment erases transistors to turn them on and programs them to turn them off, other floating gate processes erase transistors to turn them off and program them to turn them on. Such skilled persons will realize that either sort of floating gate process is suitable for use with the present invention.

Figure 2:
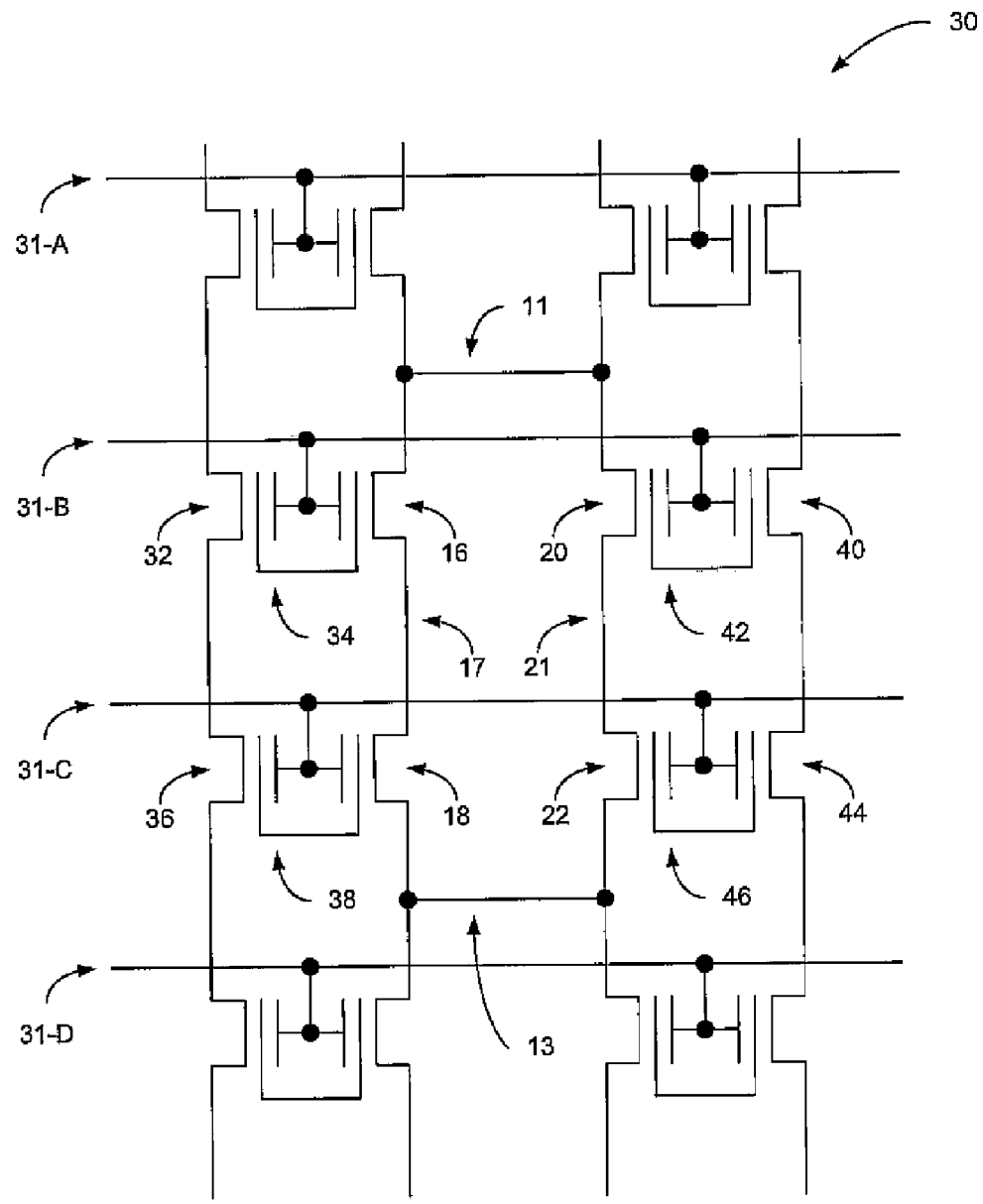
FIG. 2 is a schematic diagram of a portion of an array of flash memory cells illustrating their use in implementing a switching element in an FPGA to allow a radiation-tolerant programmable connection between two circuit elements.

Referring now to FIG. 2, a portion 30 of an array of memory cells such as may be found in a flash-based FPGA integrated circuit is shown. Elements in FIG. 2 that also appear in FIG. 1B will be designated using the same reference numerals used for those elements in FIG. 1A and FIG. 1B.

While drawn as a schematic diagram, FIG. 2 accurately shows the physical relationships between the transistors in the portion 30 of the memory array in a preferred embodiment of the invention. Persons skilled in the art will realize that other circuit configurations and physical topologies could be used and the embodiment shown in FIG. 2 is in no way limiting. Shown in the figure are four rows and four columns of floating gate transistors forming four rows and two columns of memory cells, since two transistors sharing a floating gate node form a single memory cell. All the transistors in a single row have their control gate nodes coupled together by their associated row lines 31-A, 31-B, 31-C and 31-D. Similarly, all transistors are coupled in series source/drain-node-to-source/drain-node moving down each column. This is done because it makes for a much more compact layout than if the source/drain nodes of adjacent transistors were separated. In portion 30 of the memory array, the outside columns comprise memory transistors while the two central columns are switch transistors.

A radiation-tolerant switch element is shown in FIG. 2 and includes switch transistors 16, 18, 20, and 22. Switch transistor 16 is part of a memory cell that also includes memory transistor 32, with which it shares a floating gate 34. Similarly, switch transistor 18 is part of a memory cell that also includes memory transistor 36, with which it shares a floating gate 38; switch transistor 20 is part of a memory cell that also includes memory transistor 40, with which it shares a floating gate 42; and switch transistor 22 is part of a memory cell that also includes memory transistor 44, with which it shares a floating gate 46. Interconnects 11, 13, 17 and 21 are shown to illustrate how the physical relationship of the cells in this embodiment corresponds to the circuit relationship illustrated in FIG. 1B.

Persons of average skill in the art will appreciate that most if not all of the source/drain nodes between floating gate transistors in FIG. 2 will also be coupled to other circuit elements that are not shown in FIG. 2 by means of interconnects that are also not shown. These interconnects are omitted to avoid overcomplicating the disclosure and obscuring the inventive aspects therein. For example, the gate and source/drain nodes of the memory transistors are coupled to various programming circuits. Many flash transistor programming circuits suitable for use with the present invention are known in the art and discussing them in detail would needlessly overcomplicate the disclosure.

Figure 1C:
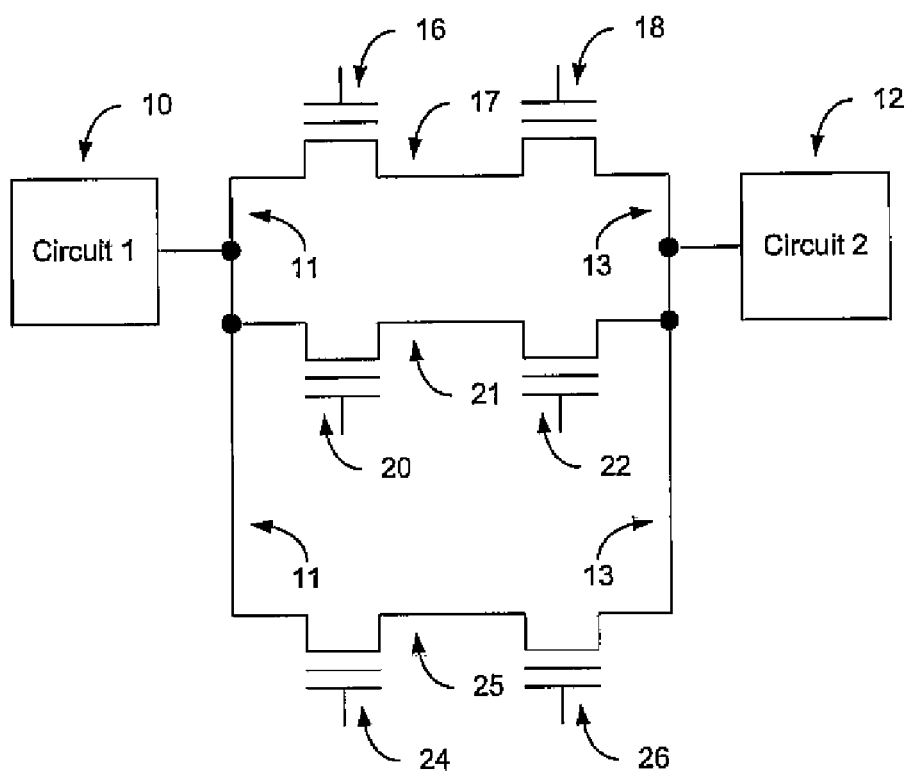
FIG. 1C is a schematic diagram showing a portion of a group of memory cells illustrating their use as a switching element in an FPGA to allow a radiation-tolerant programmable connection between two circuit elements.

In the event that it is desired to provide an additional measure of radiation tolerance to FPGA switching according to the present invention, one or more additional series strings of switch transistors may be added to the switching element. It bears repeating that the floating gate of each switch transistor in a single switching element is independent from the floating gate of each of the other switch transistors. As shown in FIG. 1C, one series string of additional switch transistors 24 and 26 joined by internal interconnect 25 may be added. Persons of ordinary skill in the art will appreciate each additional series strings of switch transistors that is added decreases the overall probability of switch failure, but at the cost of the additional area overhead associated with the additional switch transistors and their associated memory transistors.

Figure 1D:
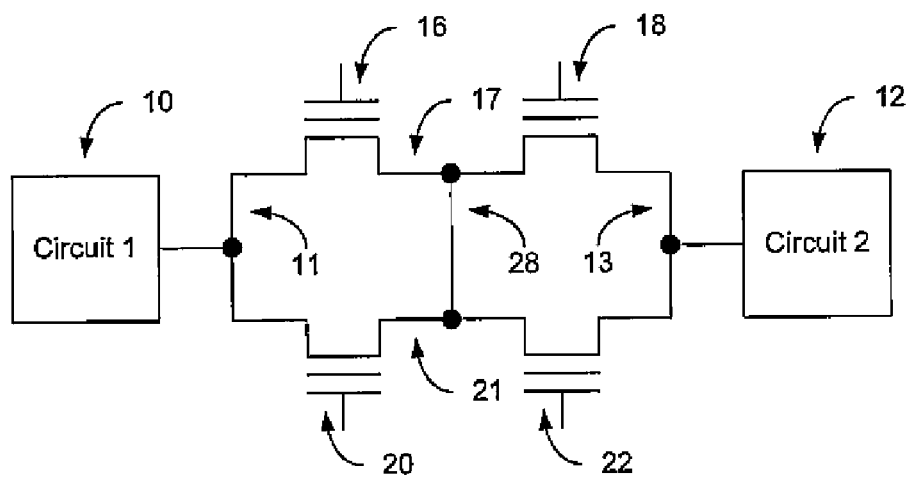
FIG. 1D is a schematic diagram showing a portion of a group of memory cells illustrating their use as a switching element in an FPGA to allow a radiation-tolerant programmable connection between two circuit elements.

In addition, in order to minimize the on-resistance of the switch element in the event that one of the switch transistors is turned off by a radiation event, interconnects 17 and 21 may be coupled together as shown in FIG. 1D at reference numeral 28 to bridge the centers of each pair of the series-coupled switch transistors. This assures that the three switch transistors in the circuit that are still turned on will still conduct current. Coupling together or isolating interconnects 17 and 21 is a matter of design choice. In the case of a single transistor 16, 18, 20 and 22 being hit in the on condition (relatively likely) the circuit performance will be significantly improved. However in the off condition, the chances are doubled that two radiation strikes to any two transistors out of transistors 16, 18, 20 and 22 (very unlikely) will result in making an undesired connection.

Persons skilled in the art will realize that the present invention may be practiced in a variety of different ways. For example, while the embodiments discussed so far have employed n-channel floating gate transistors, the same circuit topologies could also employ p-channel floating gate transistors. Although different circuitry would be required in portions of the FPGA that have not been described for simplicity and clarity of presentation, the approach of using two series switches in parallel with two other series switches will operate in substantially the same manner when employing p-channel floating gate transistors to construct the memory transistor and switch transistor pairs.

Figure 3:
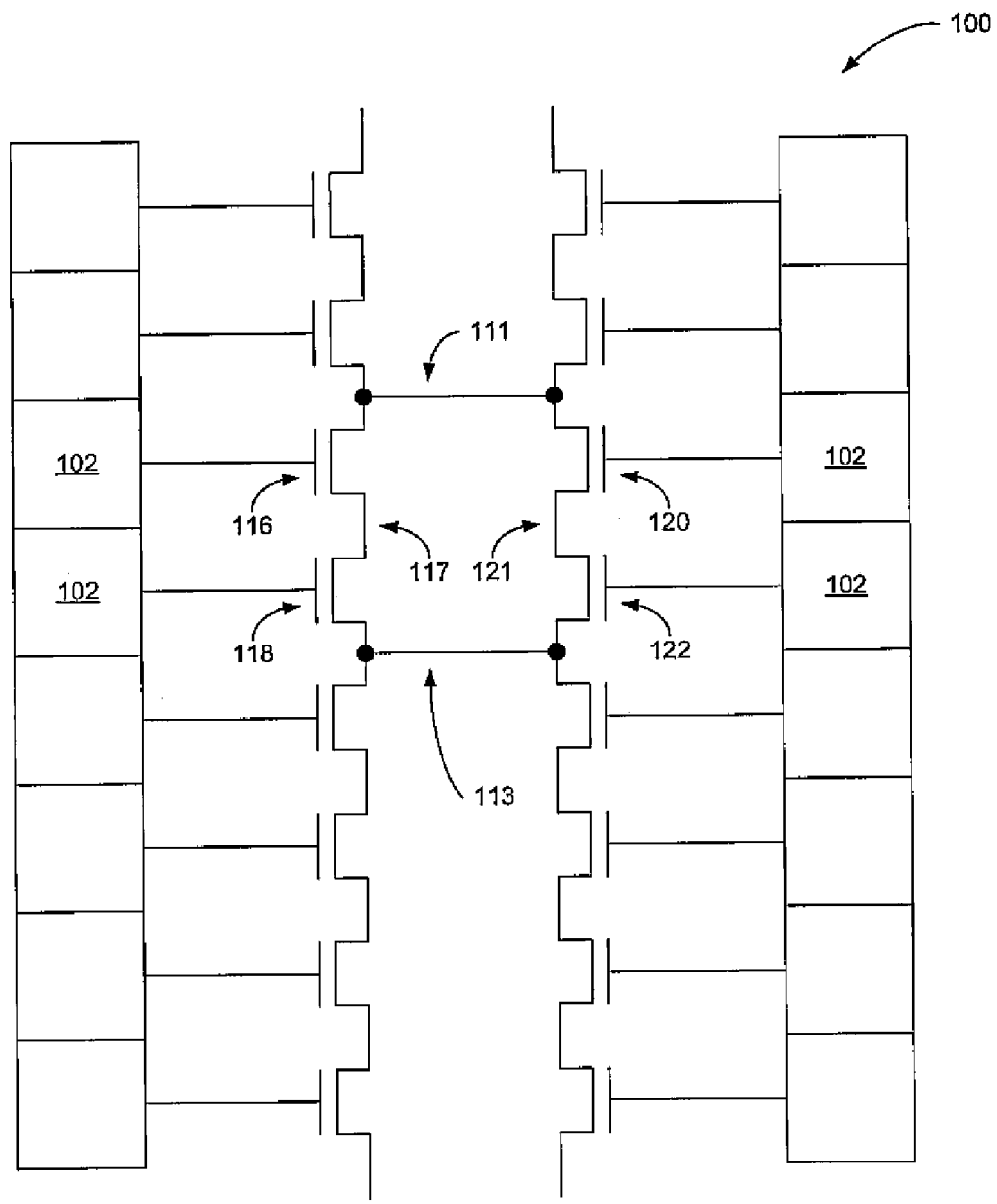
FIG. 3 is a schematic diagram of a portion of an array of memory cells and standard transistor switches illustrating their use in implementing a switching element in an FPGA to allow a radiation-tolerant programmable connection between two circuit elements.

The present invention may also be practiced using different sorts of memory elements combined with standard switch transistors. Such an arrangement is illustrated in FIG. 3. A portion of an FPGA switch array comprising memory cells and standard switch transistors is shown generally by reference number 100. Shown are two columns of memory cells, four exemplary memory cells (that control an exemplary four switch transistor switching element) being labeled 102. Disposed between the memory cells are two columns of standard switch transistors, each of which has a gate node coupled to one of the memory cells. Persons skilled in the art will appreciate that while this is a typical layout for a FPGA switch array, many other arrangements are possible and the exemplary embodiment shown in FIG. 3 is in no way limiting. Such skilled persons will realize that while the method of storing the programming data is different in these embodiments, the function of the switches in response to radiation events adversely affecting the memory cells controlling them is substantially the same as the previously discussed embodiments of the invention.

A radiation-tolerant switch element is shown in FIG. 3 and includes standard switch transistors 116, 118, 120, and 122. The entire switch element connects interconnect 111 to interconnect 113 when in the on condition and isolates them when in the off condition. Switch transistor 116, interconnect 117 and switch transistor 118 are coupled in series between interconnects 111 and 113 in parallel with switch transistor 120, interconnect 121 and switch transistor 122 which are also coupled in series between interconnects 111 and 113. One principle of the present invention is that the mechanism controlling each of the four switch transistors 116, 118, 120 and 122 is independent of the control mechanisms controlling all the other switches. In this embodiment, that means that the memory cells 102 are all independent of each other.

Many different circuits can be used for implementing memory cell 102 and several exemplary memory cells are shown in FIGS. 4A, 4B, 4C, 4D and 4E. These exemplary memory cells can use any sort of flash transistor like, for example, floating gate, SONOS or nano-crystal.

FIG. 4A illustrates a first flash-based memory cell generally indicated by reference number 130. Memory cell 130 comprises n-channel flash transistors 131 and 132 coupled together through output node 133 in series between ground connection 134 and power connection 135. During normal operation, n-channel flash transistors 131 and 132 are programmed to opposite states. If transistor 131 is programmed on then transistor 132 will be programmed off causing output node 133 to be coupled to ground. Similarly, if transistor 131 is programmed off then transistor 132 will be programmed on causing output node 63 to be coupled to the power supply. Output node 133 is coupled to a circuit or device in the FPGA to control the circuit or device like, for example, a standard switch transistor such as switch transistors 116, 118, 120 and 122 in FIG. 3. Persons skilled in the art will realize that ground connection 134 and power connection 135 are programming lines that are coupled to ground and an appropriate power supply respectively during normal operation, but that can be driven to various voltages during programming and erase operations to allow the flash transistors in memory cell 130 to be programmed. Similarly, the gates of flash transistors 131 and 132 are also programming lines that are coupled to appropriate voltage levels during normal operation but are driven to various voltages during programming and erase operations.

FIG. 4B illustrates a second flash-based memory cell generally indicated by reference number 140. Memory cell 140 comprises n-channel flash transistor 141 and p-channel flash transistor 142 coupled together through output node 143 in series between ground connection 144 and power connection 145. During normal operation, n-channel flash transistor 141 and p-channel flash transistor 142 are programmed to opposite states. If transistor 141 is programmed on then transistor 142 will be programmed off causing output node 143 to be coupled to ground. Similarly, if transistor 141 is programmed off then transistor 142 will be programmed on causing output node 143 to be coupled to the power supply. Output node 143 is coupled to a circuit or device in the FPGA to control the circuit or device like, for example, a standard switch transistor such as switch transistors 116, 118, 120 and 122 in FIG. 3. Persons skilled in the art will realize that ground connection 144 and power connection 145 are programming lines that are coupled to ground and an appropriate power supply respectively during normal operation, but that can be driven to various voltages during programming and erase operations to allow the flash transistors in memory cell 140 to be programmed. Similarly, the gates of flash transistors 141 and 142 are also programming lines that are coupled to appropriate voltage levels during normal operation but are driven to various voltages during programming and erase operations.

FIG. 4C illustrates a third flash-based memory cell generally indicated by reference number 150. Memory cell 150 comprises n-channel flash transistor 151 and re-channel standard load transistor 152 coupled together through output node 153 in series between ground connection 154 and power connection 155. In memory cell 150 only re-channel flash transistor 151 is programmed on or off. Load transistor 152 is an n-channel transistor with a threshold voltage appropriate for the amount of pull-up current desired. If transistor 151 is programmed on then it sinks more current than load transistor 152 can source causing output node 153 to be driven substantially to ground. Similarly, if transistor 151 is programmed off then load transistor 152 will source current into output node 153 causing it to be substantially driven to the power supply voltage. Output node 153 is coupled to a circuit or device in the FPGA to control the circuit or device like, for example, a standard switch transistor such as switch transistors 116, 118, 120 and 122 in FIG. 3. Persons skilled in the art will realize that ground connection 154 and power connection 155 are really programming lines that are coupled to ground and an appropriate power supply respectively during normal operation, but that can be driven to various voltages during programming and erase operations to allow the flash transistor in memory cell 150 to be programmed. Similarly, the gate of flash transistors 151 is also a programming line that is coupled to appropriate voltage levels during normal operation but are driven to various voltages during programming and erase operations.

FIG. 4D illustrates a fourth flash-based memory cell generally indicated by reference number 160. Memory cell 160 comprises n-channel flash transistor 161 and load resistor 162 coupled together through output node 163 in series between ground connection 164 and power connection 165. In memory cell 160 only n-channel flash transistor 161 is programmed on or off Load resistor 162 is resistor with a resistance appropriate for the amount of pull-up current desired. If transistor 161 is programmed on then it sinks more current than load resistor 162 can source causing output node 163 to be driven substantially to ground. Similarly, if transistor 161 is programmed off then load resistor 162 will source current into output node 163 causing it to be substantially driven to the power supply voltage. Output node 163 is coupled to a circuit or device in the FPGA to control the circuit or device like, for example, a standard switch transistor such as switch transistors 116, 118, 120 and 122 in FIG. 3. Persons skilled in the art will realize that ground connection 164 and power connection 165 are really programming lines that are coupled to ground and an appropriate power supply respectively during normal operation, but that can be driven to various voltages during programming to allow the flash transistor in memory cell 160 to be programmed. Similarly, the gate of flash transistors 161 is also a programming line that is coupled to appropriate voltage levels during normal operation but are driven to various voltages during programming and erase operations.

FIG. 4E illustrates a fifth flash-based memory cell generally indicated by reference number 170. Memory cell 170 comprises n-channel flash transistors 131 and 132 coupled together through output node 133 in series between ground connection 134 and power connection 135. Memory cell 170 further comprises standard access transistor 172 coupled to output node 133. Since standard access transistor 172 is turned off during normal operation, the normal operation of memory cell 170 is substantially identical to memory cell 130 illustrated in FIG. 4A and identical structures present in FIG. 4E have the same reference numbers as they did in FIG. 4A. Standard access transistor 172 may be used to supply programming current or control the voltage on output node 133 during programming. As is known in the art, different flash processes require different programming methods and circuits and a detailed discussion of the use of standard access transistor 172 would needlessly overcomplicate the disclosure and obscure the inventive aspects being presented. Persons skilled in the art will realize that it in any given design it may be necessary or desirable to add a standard access transistor coupled to output node 143, 153 or 163 in memory cells 140, 150 or 160 previously described in FIGS. 4B, 4C and 4D respectively and the presence or absence of the access transistor in any of these cells is a matter of design choice. Such skilled persons will also realize that may other memory cells suitable for use with the present invention are possible and the cells shown and described herein are exemplary only and in no way limiting of the present invention. For example, n-channel flash transistors could be replaced by p-channel flash transistors in any of the embodiments of FIG. 4A though FIG. 4E, n-channel standard load transistors could be replaced by p-channel standard load transistors, n-channel standard access transistors could be replaced by p-channel standard access transistors, and the power connection node could be replaced by a ground connection node and vice versa such that the load devices would be coupled between the output nodes and the ground connection and a flash device would be coupled between the output node and the power connection.

While FPGAs employing flash technology are generally considered to be more reliable than FPGAs constructed using memory cells constructed out of standard transistors like, for example, Static Random Access Memory (SRAM) cells, the present invention can also be used to improve the radiation tolerance of such FPGAs. FIG. 5A illustrates an SRAM memory cell 180 that is well known in the art that can be used to replace the flash-based memory cell 102 in the FPGA switch array shown in FIG. 3. Persons skilled in the art will realize that other SRAM cells are known in the art that could be used with the present invention. For example, the two pass transistors shown in FIG. 5A form a single port, but additional ports could be added to the SRAM cell. Ports can also be built by employing a single pass transistor. If a read-only port is desired, two series transistors, one with its gate coupled to one of the internal nodes and the other with its gate coupled to a row access line may be used. All these variations and more are known in the art and the choice of exemplary SRAM cell 180 in FIG. 5 for illustrative purposes in no way limits the present invention.

Figure 5B:
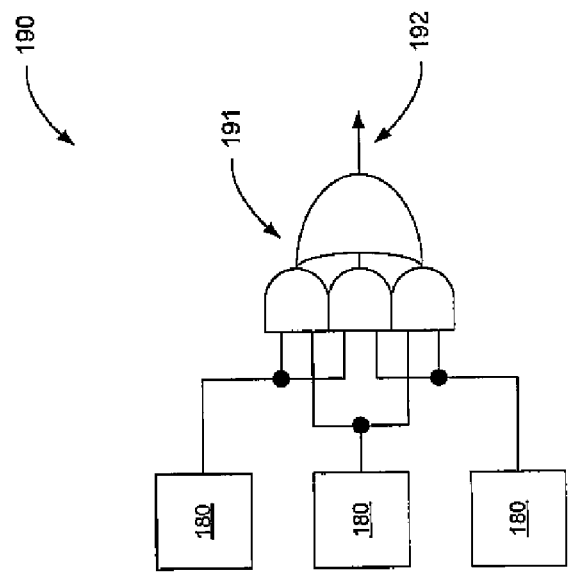
FIG. 5B is a prior art Triple Module Redundancy scheme that may be used with the memory cell of FIG. 5A.
Figure 5A:
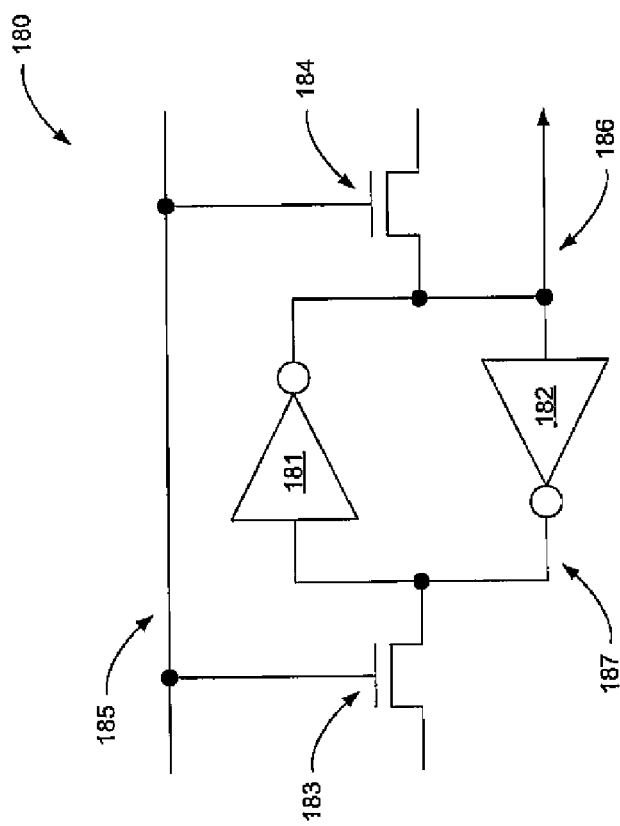
FIG. 5A is a prior art SRAM memory cell.

Increasing radiation tolerance using a TMR scheme such as the one shown in FIG. 5B in an SRAM-based FPGA with a FPGA switch array layout like the one shown in FIG. 3 can be difficult or awkward to implement. Typically the memory cells 102 and the array of standard switch transistors are pitch-matched to each other, and there often is no good place to put the necessary MAJ3 gates 191 or the routing lines connecting the memory cells 180 and the MAJ3 gates 191. Employing the present invention by using four independent memory cells 180 (in place of the four independent memory cells 102) to control the four standard switch transistors 116, 118, 120 and 122 as shown in FIG. 3 to create a single switching element provides a very homogeneous solution to hardening the array against SEU events. The use of a first set of two series switches in parallel with a second set of series switches acts to prevent unwanted connections or disconnections just as it did with the embodiments employing floating-gate transistors. Like any SRAM based FPGA, an FPGA including the present invention will be more reliable in a radiation environment if scrubbing is also employed.

In a radiation environment, particles can strike the FPGA from any direction. If the particle comes in at a very sharp angle (i.e., nearly parallel) relative to the surface of the silicon, it is possible for the particle to strike two different nodes that are in close proximity causing two different SEUs. This is known in the art as a "Double Strike." Double strikes that flip two SRAM memory cells 180 in single switching element—with either a TMR scheme or the present invention—can cause an unwanted connection or disconnection. This is primarily an issue in SRAM-based FPGAs. In order to prevent a double strike, the memory cells 180 must be placed a sufficient distance apart (known in the art as the "Double Strike Distance") so that occurrences of double strikes affecting a single switching element are statistically insignificant. The double strike distance must be empirically determined and varies from one semiconductor process to another.

Figure 6:
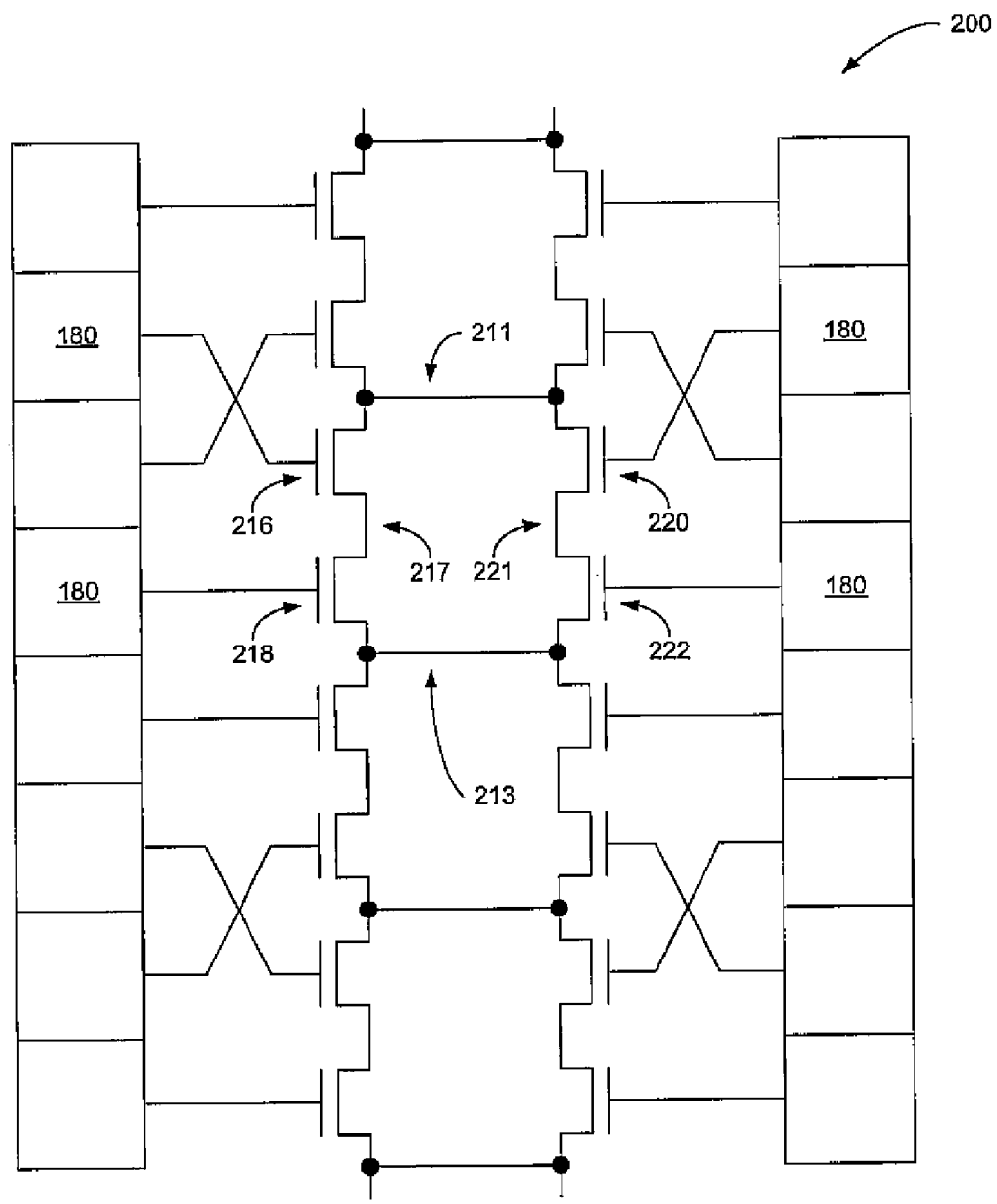
FIG. 6 is a schematic diagram of a portion of an array of memory cells and standard transistor switches illustrating their use in implementing a switching element in an FPGA to allow a radiation-tolerant programmable connection between two circuit elements.

FIG. 6 illustrates a portion of an FPGA switch array 200 employing the present invention to create a radiation tolerant switching element with the four labeled SRAM memory cells 180 controlling four standard switch transistors 216, 218, 220 and 222. Interconnects 211 and 213 are isolated or coupled together by the switching element. Standard switch transistors 216 and 218 are coupled in series by means of interconnect 217 while in parallel standard switch transistors 220 and 222 are coupled in series by means of interconnect 221.

The interconnections between the SRAM memory cells 180 and the standard switch transistors 216, 218, 220 and 222 are different in FIG. 6 than the analogous connections between the memory cells 102 and the standard switch transistors 116, 118, 120 and 122 in FIG. 3. FIG. 6 assumes that the double strike distance is less than the height of a memory cell or the width of the array of switches between the two columns of memory cells which means that any two memory cells 180 may not be at adjacent locations in the SRAM array portion of the FPGA switch array 200. Thus two memory cells 180 that control switch transistors in the same radiation tolerant switching element must either be located on opposite sides of the switches or be two rows apart to be hardened against double strikes. Persons skilled in the art will appreciate that if the double strike distance were larger than the above assumption, that the memory cells 180 would have to be placed even further apart, a more complicated interconnection scheme between them and the switch transistors in the switching elements would be required, and that such an arrangement is within the scope of the present invention. Such skilled persons will also realize that that larger FPGA switch arrays can be created by duplicating the exemplary FPGA switch array 200 of FIG. 6 many times in both the horizontal and vertical directions. In such an embodiment, SRAM memory cells 180 will be adjacent not only to other SRAM memory cells 180 above and below them, but also to SRAM memory cells that are adjacent horizontally and diagonally, and care must be taken to not assign control of any two switch transistors in the same radiation hardened switch element to any two SRAM memory cells 180 within the double strike distance in any direction or the degree of radiation hardening achieved will be substantially reduced. In this embodiment, an FPGA including the present invention will be more reliable in a radiation environment if scrubbing is also employed.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for operating a radiation-tolerant FPGA switching element, comprising the steps of:
    providing a programmable connection between two connection nodes with a plurality of parallel paths, a first parallel path comprising a first switch transistor and a second switch transistor coupled in series between the two connection nodes, a second parallel path comprising a third switch transistor and a fourth switch transistor coupled in series between the two connection nodes, each of the first through fourth switch transistors including a floating gate;
    providing a first memory element for the first switch transistor having a floating gate coupled to the first switch transistor;
    providing a second memory element for the second switch transistor having a floating gate coupled to the second switch transistor;
    providing a third memory element for the third switch transistor having a floating gate coupled to the third switch transistor;
    providing a fourth memory element for the fourth switch transistor having a floating gate coupled to the fourth switch transistor; and
    programming the first through fourth memory elements to place all of the switch transistors in the same state.

2. The method of claim 1, wherein programming the first through fourth memory elements places the first through fourth switch transistors in the on state.

3. The method of claim 1, wherein programming the first through fourth memory elements places the first through fourth switch transistors in the off state.

4. The method of claim 1, further comprising bridging together intermediate nodes of the plurality of parallel paths.

5. The method of claim 1, further comprising placing the first through fourth memory elements in the switching element into an array of substantially similar memory elements, wherein each of the first through fourth memory elements in the switching element is assigned to an array location more than the double strike distance away from the location of every other memory element in the switching element.

6. The method of claim 1, further comprising placing the first through fourth memory elements in the switching element into an array of substantially similar memory elements, wherein each of the first through fourth memory elements in the switching element is assigned to an array location that is not adjacent to the location of every other memory element in the switching element.

7. A method of programming radiation-tolerant FPGA switching elements, each element having (i) a plurality of parallel paths between two connection nodes, each parallel path comprising first and second switch transistors coupled in series, and (ii) an independent memory element controlling each switch transistor in each parallel path, the method comprising:
    determining the desired connectivity between the connection nodes for each switching element; and
    programming the memory elements in each switching element to place all the switch transistors in the correct state for the desired connectivity; wherein
    the correct state for the first through fourth switch transistors in each switching element is on when a connection is desired; and
    the correct state for the first through fourth switch transistors in each switching element is off when a connection is not desired.

8. A radiation-tolerant FPGA switching element, comprising:
    a first circuit node;
    a second circuit node that can be programmably connected to the first circuit node;
    a first switch transistor and a second switch transistor coupled in series between the first and second circuit nodes;
    a third switch transistor and a fourth switch transistor coupled in series between the first and second circuit nodes;
    a first memory element coupled to a control element of the first switch transistor;
    a second memory element coupled to a control element of the second switch transistor;
    a third memory element coupled to a control element of the third switch transistor; and
    a fourth memory element coupled to a control element of the fourth switch transistor, and
    wherein the first through fourth memory elements are all programmed to be in the same one of an on and an off state.

9. The radiation-tolerant FPGA switching element of claim 8, wherein:
    each of the switch transistors is a floating gate transistor;
    each of the memory elements is a floating gate transistor;
    the floating gate of the first memory element is coupled to the floating gate of the first switch transistor;
    the floating gate of the second memory element is coupled to the floating gate of the second switch transistor;
    the floating gate of the third memory element is coupled to the floating gate of the third switch transistor; and
    the floating gate of the fourth memory element is coupled to the floating gate of the fourth switch transistor.

10. The radiation-tolerant FPGA switching element of claim 8, wherein:
    each of the memory elements is a static random access memory cell having an output node;
    each of the switch transistors is a standard transistor having a gate;
    the output node of the first memory element is coupled to the gate of the first switch transistor;
    the output node of the second memory element is coupled to the gate of the second switch transistor;

the output node of the third memory element is coupled to the gate of the third switch transistor; and
the output node of the fourth memory element is coupled to the gate of the fourth switch transistor.

11. The radiation-tolerant FPGA switching element of claim 8, wherein:
each of the memory elements further comprises:
an output node,
a power node,
a ground node,
a flash transistor coupled between the power node and the output node, and
a flash transistor coupled between the output node and the ground node;
each of the switch transistors is a standard transistor having a gate;
the output node of the first memory element is coupled to the gate of the first switch transistor;
the output node of the second memory element is coupled to the gate of the second switch transistor;
the output node of the third memory element is coupled to the gate of the third switch transistor; and
the output node of the fourth memory element is coupled to the gate of the fourth switch transistor.

12. The radiation-tolerant FPGA switching element of claim 8, wherein:
each of the memory elements further comprises:
an output node,
a power node,
a ground node,
a standard load transistor coupled between the power node and the output node, and
a flash transistor coupled between the output node and the ground node;
each of the switch transistors is a standard transistor having a gate;
the output node of the first memory element is coupled to the gate of the first switch transistor;
the output node of the second memory element is coupled to the gate of the second switch transistor;
the output node of the third memory element is coupled to the gate of the third switch transistor; and
the output node of the fourth memory element is coupled to the gate of the fourth switch transistor.

13. The radiation-tolerant FPGA switching element of claim 8, wherein:
each of the memory elements further comprises:
an output node,
a power node,
a ground node,
a load resistor coupled between the power node and the output node, and
a flash transistor coupled between the output node and the ground node;
each of the switch transistors is a standard transistor having a gate;
the output node of the first memory element is coupled to the gate of the first switch transistor;
the output node of the second memory element is coupled to the gate of the second switch transistor;
the output node of the third memory element is coupled to the gate of the third switch transistor; and
the output node of the fourth memory element is coupled to the gate of the fourth switch transistor.

14. The radiation-tolerant FPGA switching element of claim 8, wherein the first, second, third and fourth memory elements are SRAM cells.

15. The radiation-tolerant FPGA switching element of claim 8, wherein the first, second, third and fourth memory elements are SRAM cells comprising:
first and second inverters each with an input and an output; and
a first pass transistor with a source, wherein:
the output of the first inverter is coupled to the input of the second inverter and the source of the first pass transistor, and the output of the second inverter is coupled to the input of the first inverter.

16. The radiation-tolerant FPGA switching element of claim 15, wherein the first, second, third and fourth memory elements are SRAM cells further comprising:
a second pass transistor with a source, wherein:
the source of the second pass transistor is coupled to the output of the second inverter and the input of the first inverter.

17. The radiation-tolerant FPGA switching element of claim 8, wherein:
each of the first, second, third, and fourth memory elements is part of an array of memory elements; and
none of the first, second, third, and fourth memory elements is placed in the array of memory elements in a location that is adjacent to any other of the first, second, third, and fourth memory elements.

18. The radiation-tolerant FPGA switching element of claim 8, wherein:
none of the first, second, third, and fourth memory elements is placed in a location that is within the double strike distance of any other of the first, second, third, and fourth memory elements.

19. The radiation-tolerant FPGA switching element of claim 8, further comprising:
fifth and sixth switch transistors coupled in series between the first and second circuit nodes;
a fifth memory element coupled to a control element of the fifth switch transistor; and
a sixth memory element coupled to a control element of the sixth switch transistor.

20. The radiation-tolerant FPGA switching element of claim 19, wherein the first, second, third, fourth, fifth, and sixth memory elements each further comprise:
an output node;
a power node;
a ground node;
a first flash transistor coupled between the power node and the output node; and
a second flash transistor coupled between the output node and the ground node.

21. The radiation-tolerant FPGA switching element of claim 19, wherein the first, second, third, fourth, fifth, and sixth memory elements each further comprise:
an output node;
a power node;
a ground node;
a standard load transistor coupled between the power node and the output node; and
a flash transistor coupled between the output node and the ground node.

22. The radiation-tolerant FPGA switching element of claim 19, wherein the first, second, third, fourth, fifth, and sixth memory elements each further comprise:
an output node;
a power node;
a ground node;
a load resistor coupled between the power node and the output node; and a flash transistor coupled between the output node and the ground node.

23. The radiation-tolerant FPGA switching element of claim 19, wherein:
the first, second, third, fourth, fifth, and sixth memory elements are SRAM cells.

24. The radiation-tolerant FPGA switching element of claim 19, wherein:
each of the first, second, third, fourth, fifth, and sixth memory elements is part of an array of memory elements; and
none of the first, second, third, fourth, fifth, and sixth memory elements is placed in the array of memory elements in a location that is adjacent to any other of the first, second, third, fourth, fifth, and sixth memory elements.

25. The radiation-tolerant FPGA switching element of claim 19, wherein:
none of the first, second, third, fourth, fifth, and sixth memory elements is placed in a location that is within the double strike distance of any other of the first, second, third, fourth, fifth, and sixth memory elements.

26. The radiation-tolerant FPGA switching element of claim 8, wherein the memory transistors are n-channel transistors and the switch transistors are n-channel transistors.

27. The radiation-tolerant FPGA switching element of claim 8, wherein the memory transistors are p-channel transistors and the switch transistors are p-channel transistors.

* * * * *